(12) United States Patent
Kuo

(10) Patent No.: US 8,579,389 B1
(45) Date of Patent: Nov. 12, 2013

(54) SERVER CABINET

(75) Inventor: Szu-Wei Kuo, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/534,242

(22) Filed: Jun. 27, 2012

(30) Foreign Application Priority Data

May 31, 2012 (TW) .............................. 101119640 A

(51) Int. Cl.
*F16B 12/00* (2006.01)
(52) U.S. Cl.
USPC .............................................. 312/111
(58) Field of Classification Search
USPC ................. 312/111; 108/64; 292/56, 240, 292/194–218, 281, 285
See application file for complete search history.

(56) References Cited

U.S. PATENT DOCUMENTS

| | | | | |
|---|---|---|---|---|
| 314,641 A * | 3/1885 | Andrews | ................. | 292/210 |
| 1,254,636 A * | 1/1918 | Barghausen | ............... | 312/111 |
| 1,520,518 A * | 12/1924 | Thomason | ................. | 108/64 |
| 1,686,515 A * | 10/1928 | Chandler | ................. | 312/108 |
| 2,785,940 A * | 3/1957 | Felton | ....................... | 312/108 |
| 3,132,883 A * | 5/1964 | Tantlinger et al. | ......... | 220/23.83 |
| 3,342,147 A * | 9/1967 | Shettles | ....................... | 108/64 |
| 3,918,781 A * | 11/1975 | Paris | ............................ | 312/111 |
| 4,043,477 A * | 8/1977 | Deese | ........................ | 220/23.4 |
| 5,090,835 A * | 2/1992 | Cox | ............................... | 403/294 |
| 5,419,064 A * | 5/1995 | Bennett | .......................... | 40/782 |
| 5,921,095 A * | 7/1999 | Lee et al. | ....................... | 62/175 |
| 6,312,068 B1 * | 11/2001 | Benner et al. | ................. | 312/111 |
| 6,598,542 B2 * | 7/2003 | Goldberg et al. | ............... | 108/64 |
| 6,626,017 B2 * | 9/2003 | Herbeck et al. | .................. | 70/63 |
| 6,679,646 B2 * | 1/2004 | Quardt et al. | ................. | 403/348 |
| 6,955,410 B1 * | 10/2005 | Nelson et al. | ................. | 312/352 |
| 7,008,027 B2 * | 3/2006 | Kelley et al. | .................. | 312/107 |

* cited by examiner

*Primary Examiner* — Darnell Jayne
*Assistant Examiner* — Timothy M Ayres
(74) *Attorney, Agent, or Firm* — Altis & Wispro Law Group, Inc.

(57) ABSTRACT

A server cabinet includes a top wall and two sidewalls. The top wall defines a T-shaped first slot and a T-shaped second slot adjacent to each sidewall. Each first slot adjacent to one sidewall aligns with a second slot adjacent to the other sidewall. Each first slot includes a first channel extending through the corresponding sidewall and a first receiving slot communicating with the first channel. Each second slot includes a second channel extending through the corresponding sidewall and a second receiving slot communicating with the second channel. A T-shaped mounting member is pivotably mounted in each first channel. Each mounting member includes a pivot portion received in the first channel and a locking portion formed from one end of the pivot portion and capable of being received and secured in the first receiving slot.

3 Claims, 2 Drawing Sheets

SERVER CABINET

BACKGROUND

1. Technical Field

The present disclosure relates to a server cabinet.

2. Description of Related Art

A server room is generally equipped with a plurality of separated server cabinets, each receiving a plurality of servers. When the earthquake or other quake occurs, collisions will occur among the cabinets because the separated cabinets are easily moved.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
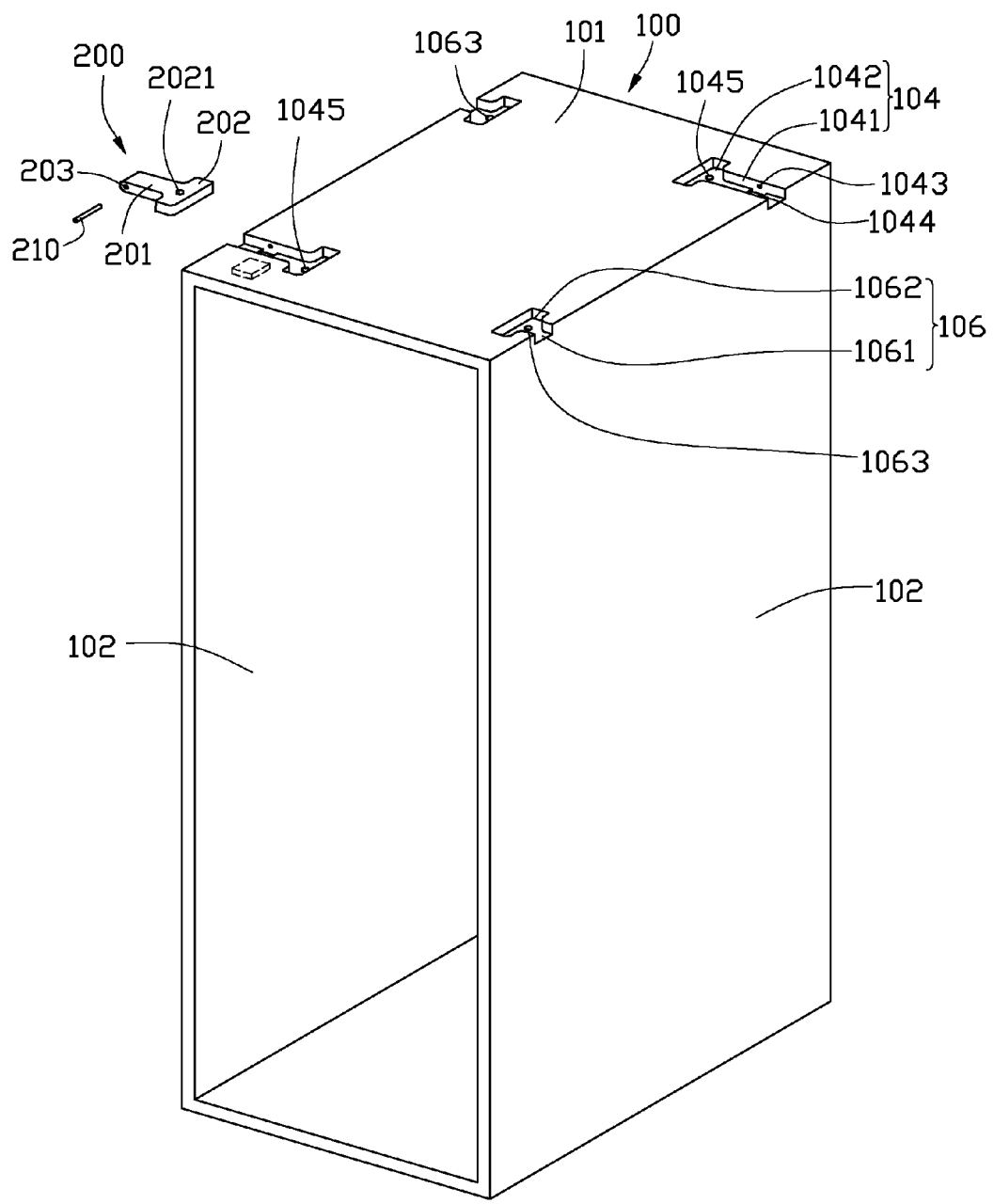
FIG. 1 is an exploded, isometric view of a server cabinet, according to an exemplary embodiment.

Referring to FIG. 1, an embodiment of a server cabinet 100 includes a top wall 101, two sidewalls 102 extending down from opposite sides of the top wall 101, and two substantially T-shaped mounting members 200 pivotably mounted to the top wall 101.

The top wall 101 defines a substantially T-shaped first slot 104 and a substantially T-shaped second slot 106 adjacent to each sidewall 102. Each first slot 104 adjacent to a first one of the sidewalls 102 aligns with a corresponding second slot 106 adjacent to a second one of the sidewalls 102. Each first slot 104 includes a first channel 1041 extending through the corresponding sidewall 102 and a first receiving slot 1042 perpendicular to and communicating with an end of the first channel 1041 opposite to the corresponding sidewall 102. Two pivot holes 1043 are respectively defined in opposite sidewalls bounding each first channel 1041. A recessed portion 1044 is defined in a bottom wall of each first channel 1041, adjacent to the pivot holes 1043. A screw hole 1045 is defined in a bottom wall of each first receiving slot 1042. Each second slot 106 includes a second channel 1061 extending through the corresponding sidewall 102 and parallel to the first channel 1041, and a second receiving slot 1062 perpendicular to and communicating with an end of the second channel 1061, opposite to the corresponding sidewall 102. A screw hole 1063 is defined in a bottom wall of the second receiving slot 1062. A width of the first channel 1041 is equal to a width of the second channel 1061. A length of the first channel 1041 is greater than a length of the second channel 1061. The shape and size of the first receiving slot 1042 are same as the shape and size of the second receiving slot 1062. In the exemplary embodiment, the first and second receiving slots 1042 and 1062 are rectangular.

The mounting members 200 are pivotably mounted in the first slots 104. Each mounting member 200 includes a pivot portion 201 received in the first channel 1041, and a locking portion 202 perpendicularly extending from a first end of the pivot portion 201 and capable of being received in the first receiving slot 1042. A through hole 203 is defined in a second end of the pivot portion 201 opposite to the locking portion 202, extending through opposite sides of the pivot portion 201. A mounting hole 2021 is defined in a center of each locking portion 202, extending through a top and a bottom of the locking portion 202. A shaft 210 extends through the through hole 203, with opposite ends of the shaft 210 received in the pivot holes 1043.

Figure 2:
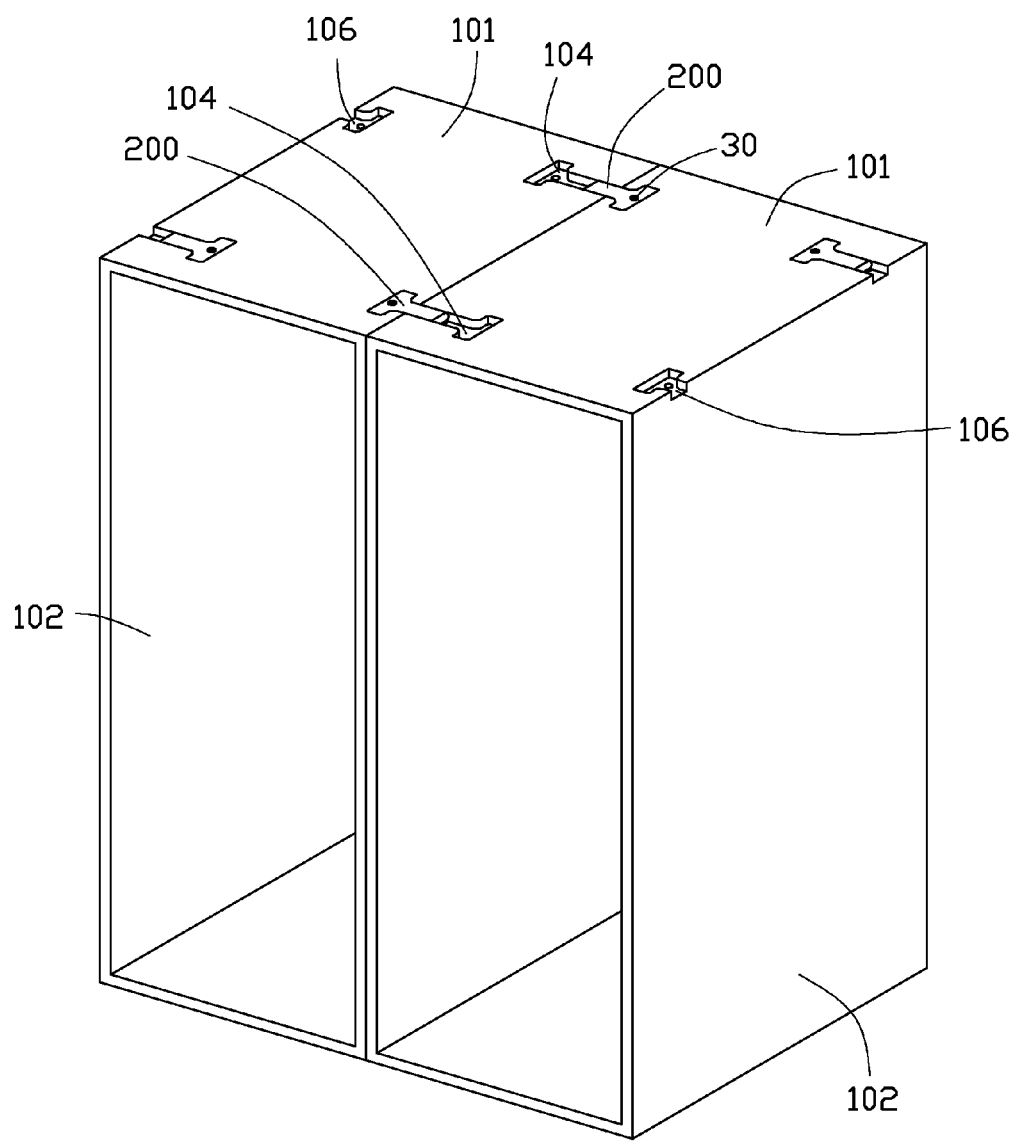
FIG. 2 is a view of two server cabinets assembled together.

Referring to FIG. 2, when assembling the server cabinet 100 to a neighboring cabinet 100 together, the cabinet 100 and the neighboring cabinet 100 are arranged side by side. Therefore, the first channel 1041 and the second channel 1061 of the cabinet 100 adjacent to the neighboring cabinet 100 are found to be in respective communication with the second channel 1061 and the first channel 1041 of the neighboring cabinet 100 adjacent to the cabinet 100. The mounting member 200 of the cabinet 100, adjacent to the neighboring cabinet 100, is rotated toward the neighboring cabinet 100, until the locking portion 202 is received in the second receiving slot 1062 of the neighboring cabinet 100. The mounting member 200 of the neighboring cabinet 100, adjacent to the cabinet 100, is rotated toward the cabinet 100, until the locking portion 202 is received in the second receiving slot 1062 of the cabinet 100. A screw 30 extends through the mounting hole 2021 to screw into the screw hole 1063. Thus, the cabinet 100 and the neighboring cabinet 100 are combined together. The recessed portion 1044 avoids the pivot portion 201 interfering with the bottom wall of the first channel 1041.

In other embodiments, the locking portions 202 may be round or other shapes. The first and second receiving slots 1042 and 1062 are also round or other shapes according to the shape of the locking portions 202.

In the embodiment, the mounting members 200 are pivotably attached to the top walls 101 to combine the server cabinets 100 together, to obtain enough shock resistance.

Even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A server cabinet, comprising:
a top wall, and a first sidewall and a second sidewall extending down from opposite sides of the top wall, wherein the top wall defines a first slot and a second slot adjacent to each of the first sidewall and the second sidewall, the first slots and the second slots are substantially T-shaped, the first slot adjacent to the first sidewall aligns with a corresponding second slot adjacent to the second sidewall, the second slot adjacent to the first sidewall aligns with a corresponding first slot adjacent to the second sidewall, wherein each first slot adjacent to the first sidewall or the second sidewall comprises a first channel, extending through the first sidewall or the second sidewall, and a first receiving slot, communicating with the first channel; and each second slot adjacent to the first sidewall or the second sidewall comprises a second channel, extending through the first sidewall or the second sidewall, and a second receiving slot, communicating with the second channel; and two substantially T-shaped mounting members each comprising a pivot portion pivotably received in the first channel of a corresponding one of the first slot; and a locking portion, extending from the pivot portion, capable of being received in the first receiving slot;

wherein a screw hole is defined in a bottom wall of the first receiving slot, a mounting hole is defined in a center of each locking portion, and a fastener extends through the mounting hole.

2. The server cabinet of claim 1, wherein the shape and size of the first receiving slots are same as the shape and size of the second receiving slots.

3. An assembly, comprising:

a server cabinet and a neighboring server cabinet arranged side by side, each of the server cabinet and the neighboring server cabinet comprising a top wall, and a sidewall extending down from a side of the top wall, the sidewall of the server cabinet contacting with the sidewall of the neighboring server cabinet, the top wall of the server cabinet defining a first slot and a second slot, both adjacent to the sidewall of the server cabinet, the first slot and the second slot of the server cabinet both being substantially T-shaped, the top wall of the neighboring server cabinet defining a first slot and a second slot, both adjacent to the sidewall of the neighboring server cabinet and aligning with the second slot and the first slot of the server cabinet respectively, the first slot and the second slot of the neighboring server cabinet both being substantially T-shaped, the first slot of the server cabinet comprising a first channel extending through the sidewall of the server cabinet, and a first receiving slot communicating with the first channel opposite to the sidewall of the server cabinet, the first slot of the neighboring server cabinet comprising a first channel extending through the sidewall of the neighboring server cabinet, and a first receiving slot communicating with the first channel opposite to the sidewall of the neighboring server cabinet; the second slot of the server cabinet comprising a second channel extending through the sidewall of the server cabinet and communicating with the first channel of the neighboring server cabinet, and a second receiving slot communicating with the second channel opposite to the sidewall of the server cabinet; the second slot of the neighboring server cabinet comprising a second channel extending through the sidewall of the neighboring server cabinet and communicating with the first channel of the server cabinet, and a second receiving slot communicating with the second channel opposite to the sidewall of the neighboring server cabinet; and two substantially T-shaped mounting members, wherein a first one of the mounting members comprises a pivot portion pivotably received in the first channel of the server cabinet and a locking portion extending from the pivot portion and capable of being received in the second receiving slot of the neighboring server cabinet; a second one of the mounting members comprises a pivot portion pivotably received in the first channel of the neighboring server cabinet, and a locking portion extending from the pivot portion and capable of being received in the second receiving slot of the server cabinet;

wherein a screw hole is defined in a bottom wall of each second receiving slot, a mounting hole is defined in a center of each locking portion, and a fastener extends through the mounting hole to screw into the screw hole of a corresponding second receiving slot.

* * * * *